United States Patent
Asteman et al.

(10) Patent No.: US 9,514,889 B2
(45) Date of Patent: Dec. 6, 2016

(54) ADDITION OF POLYMERS TO THIOPHENE MONOMERS IN THE IN SITU POLYMERIZATION

(71) Applicant: Heraeus Precious Metals GmbH & Co. KG, Hanau (DE)

(72) Inventors: Katrin Asteman, Köln (DE); Udo Merker, Köln (DE); Klaus Wussow, Netphen (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 88 days.

(21) Appl. No.: 14/384,604

(22) PCT Filed: Mar. 11, 2013

(86) PCT No.: PCT/EP2013/000710
§ 371 (c)(1),
(2) Date: Sep. 11, 2014

(87) PCT Pub. No.: WO2013/135363
PCT Pub. Date: Sep. 19, 2013

(65) Prior Publication Data
US 2015/0047889 A1    Feb. 19, 2015

Related U.S. Application Data

(60) Provisional application No. 61/611,197, filed on Mar. 15, 2012.

(30) Foreign Application Priority Data

Mar. 12, 2012 (DE) ........................ 10 2012 004 692

(51) Int. Cl.
*H01G 9/00* (2006.01)
*H01G 9/028* (2006.01)
(Continued)

(52) U.S. Cl.
CPC ............ *H01G 9/028* (2013.01); *C08G 61/126* (2013.01); *C08G 65/334* (2013.01); *C08L 71/02* (2013.01);
(Continued)

(58) Field of Classification Search
None
See application file for complete search history.

(56) References Cited

U.S. PATENT DOCUMENTS 4,514,558 A * 4/1985 Shiiki .................. C08G 75/025
528/388
4,730,083 A * 3/1988 Pastor ..................... C07C 51/15
562/423

(Continued)

FOREIGN PATENT DOCUMENTS

| CN | 101486838 | 7/2009 |
| DE | 10-2005-043828 | 3/2007 |

(Continued)

OTHER PUBLICATIONS

PCT International Search Report in PCT/EP2013/000710, mailed Aug. 13, 2013, 4 pages.

*Primary Examiner* — Seahvosh Nikmanesh
(74) *Attorney, Agent, or Firm* — Servilla Whitney LLC (57) ABSTRACT

Described is a process for the production of a capacitor, where an electrode body (1) of an electrode material (2) is provided, wherein a dielectric (3) covers one surface (4) of this electrode material (2) at least partly to form an anode body (5), where the in situ polymerization of at least one thiophene monomer in at least a part of the anode body (5) in the presence of at least one oxidizing agent and at least one polymer with the structural formula (I).

$$R^1+O-R^2+_nO-R^1 \quad (I)$$

12 Claims, 1 Drawing Sheet (51) Int. Cl.
*C08G 65/334* (2006.01)
*H01G 9/15* (2006.01)
*C08G 61/12* (2006.01)
*H01G 9/04* (2006.01)
*H05K 1/18* (2006.01)
*C08L 71/02* (2006.01)
*H01G 9/045* (2006.01)

(52) U.S. Cl.
CPC .............. *H01G 9/0036* (2013.01); *H01G 9/04* (2013.01); *H01G 9/15* (2013.01); *H05K 1/181* (2013.01); *C08G 2261/1424* (2013.01); *C08G 2261/3223* (2013.01); *C08G 2261/43* (2013.01); *C08L 2203/20* (2013.01); *H01G 9/045* (2013.01); *H05K 2201/10015* (2013.01)

(56) References Cited

U.S. PATENT DOCUMENTS

| | | | |
|---|---|---|---|
| 4,753,859 A * | 6/1988 | Brand | H01M 10/052 429/201 |
| 4,910,645 A | 3/1990 | Jonas et al. | |
| 4,963,161 A * | 10/1990 | Chi | H01M 4/02 29/623.5 |
| 5,051,485 A | 9/1991 | Schmid | |
| 7,497,879 B2 | 3/2009 | Kakuma et al. | |
| 7,515,396 B2 | 4/2009 | Biler | |
| 7,621,970 B2 * | 11/2009 | Furusawa | H01G 9/02 257/E21.008 |
| 8,405,958 B2 | 3/2013 | Takahashi et al. | |
| 8,699,208 B2 | 4/2014 | Merker et al. | |
| 2009/0154058 A1 | 6/2009 | Biler | |
| 2009/0310285 A1 | 12/2009 | Reuter | |
| 2010/0165546 A1 * | 7/2010 | Yoshida | H01G 9/0036 361/525 |

FOREIGN PATENT DOCUMENTS

| | | |
|---|---|---|
| DE | 10-2008-000321 | 9/2008 |
| DE | 10-2011-008307 | 9/2011 |
| EP | 0340512 | 11/1989 |
| WO | WO-2006/070186 | 7/2006 |
| WO | WO-2012/041506 | 4/2012 |

* cited by examiner

ADDITION OF POLYMERS TO THIOPHENE MONOMERS IN THE IN SITU POLYMERIZATION

CROSS-REFERENCE TO RELATED APPLICATIONS

This application is the National Stage entry of PCT/EP2013/000710, filed on Mar. 11, 2013, which claims priority to German Application No. 10 2012 004 692.8, filed on Mar. 12, 2012 and U.S. Ser. No. 61/611,197 filed on Mar. 15, 2012, which are incorporated herein by reference in their entireties.

FIELD

The present invention relates to a process for the production of a capacitor, the capacitor obtainable by this process, a capacitor, a reaction solution, an electronic circuit and the use of a capacitor.

BACKGROUND

A commercially available electrolyte capacitor as a rule is made of a porous metal electrode, an oxide layer serving as a dielectric on the metal surface, an electrically conductive material, usually a solid, which is introduced into the porous structure, an outer electrode (contacting), such as e.g. a silver layer, and further electrical contacts and an encapsulation. An electrolyte capacitor which is frequently used is the tantalum electrolyte capacitor, the anode electrode of which is made of the valve metal tantalum, on which a uniform dielectric layer of tantalum pentoxide has been generated by anodic oxidation (also called "forming"). A liquid or solid electrolyte forms the cathode of the capacitor. Aluminium capacitors in which the anode electrode is made of the valve metal aluminium, on which a uniform, electrically insulating aluminium oxide layer is generated as the dielectric by anodic oxidation, are furthermore frequently employed. Here also, a liquid electrolyte or a solid electrolyte forms the cathode of the capacitor. The aluminium capacitors are usually constructed as wound- or stack-type capacitors.

π-conjugated polymers are particularly suitable as solid electrolytes in the capacitors described above because of their high electrical conductivity. π-conjugated polymers are also called conductive polymers or synthetic metals. They are increasingly gaining economic importance, since polymers have advantages over metals with respect to processability, weight and targeted adjustment of properties by chemical modification. Examples of known π-conjugated polymers are polypyrroles, polythiophenes, polyanilines, polyacetylenes, polyphenylenes and poly(p-phenylene-vinylenes), a particularly important polythiophene used industrially being poly(3,4-ethylenedioxythiophene) (PEDOT), since it has a very high conductivity in its oxidized form.

The solid electrolytes based on conductive polymers can be applied to the oxide layer in various ways. EP-A-0 340 512 thus describes, for example, the production of a solid electrolyte from 3,4-ethylenedioxythiophene and the use thereof in electrolyte capacitors. According to the teaching of this publication, 3,4-ethylenedioxythiophene is polymerized on to the oxide layer in situ. In addition to the in situ polymerization described above, processes for the production of solid electrolytes in capacitors in which a dispersion comprising the already polymerized thiophene, for example the PEDOT/PSS dispersions known from the prior art, is applied to the oxide layer and the dispersing agent is then removed by evaporation are also known from the prior art.

Important properties of a capacitor are, inter alia, its low temperature properties and its life. "Low temperature properties" of a capacitor are understood as meaning the influencing of the electrical characteristic values thereof, such as, for example, the capacitance, the equivalent series resistance, the breakdown voltage or the residual current, but in particular the influencing of the equivalent series resistance, at low temperatures, in particular at temperatures down to below −40° C. The "life" of a capacitor is understood as meaning the influencing of the electrical characteristic values thereof, but in particular the influencing of the equivalent series resistance, after storage for several days, in particular after storage for 500 hours, at high temperatures, in particular at a temperature of 120° C.

The solid electrolyte capacitors which are known from the prior art, for example from EP-A-0 340 512, and are produced by in situ polymerization are characterized by a low equivalent series resistance and stable low temperature properties compared with the liquid electrolyte capacitors known from the prior art, but the life of these solid electrolyte capacitors is often still inadequate. There is therefore a demand for capacitors which show an improved life with at the same time a low equivalent series resistance and stable low temperature properties.

BRIEF SUMMARY

The present invention was based on the object of overcoming the disadvantages resulting from the prior art in connection with capacitors, in particular in connection with solid electrolyte capacitors, very particularly preferably in connection with the aluminium capacitors known from the prior art.

In particular, the present invention was based on the object of providing a process for the production of a capacitor, by means of which capacitors which, with a low equivalent series resistance, show both an adequate life and adequate low temperature properties can be provided preferably by using in situ polymerization in the production of the solid electrolyte layer.

The process for the production of the advantageous capacitors described above should moreover be distinguished in that it renders possible the production of these capacitors in the simplest possible manner, in particular with as few process steps as possible.

A contribution towards achieving the abovementioned objects is made in particular by a process for the production of a capacitor, comprising the process steps:

a) the provision of an electrode body of an electrode material, wherein a dielectric covers one surface of this electrode material at least partly to form an anode body;

b) the in situ polymerization of at least one thiophene monomer in at least a part of the anode body in the presence of at least one oxidizing agent and at least one polymer which is characterized by the structural formula (I)

(I)

in which n is an integer ≥3;

the radicals $R^2$ within the structural formula (I) can be identical or different and represent an alkylene group optionally containing a hydroxyl group or a polyether group;

the radicals $R^1$ within the structural formula (I) can be identical or different and represent a hydrogen atom, a $C_1$-$C_{10}$-alkyl group, an unsaturated $C_1$-$C_{10}$-alkylene group, an acryloyl group or a methacryloyl group, wherein at least one of the radicals $R^1$ represents a $C_1$-$C_{10}$-alkyl group, an unsaturated $C_1$-$C_{10}$-alkylene group, an acryloyl group or a methacryloyl group;

wherein a reaction solution comprising the at least one thiophene monomer, the at least one polymer having the structural formula (I), the at least one oxidizing agent and optionally one or more additives, which comprises the polymer having the structural formula (I) in a concentration of at least 1 wt. %, particularly preferably at least 5 wt. %, still more preferably at least 10 wt. % and most preferably at least 14 wt. %, in each case based on the total weight of the reaction solution, is employed for the in situ polymerization.

In process step a), an electrode body of an electrode material, wherein a dielectric covers one surface of this electrode material at least partly to form an anode body, is first provided.

BRIEF DESCRIPTION OF THE DRAWINGS

Further features of embodiments of the present invention, their nature and various advantages will become more apparent upon consideration of the following detailed description, taken in conjunction with the accompanying drawings, which are also illustrative of the best mode contemplated by the applicants, and in which like reference characters refer to like parts throughout, where.

DETAILED DESCRIPTION

In principle, the electrode body can be produced by pressing a valve metal powder of high surface area and sintering it to give a usually porous electrode body. An electrical contact wire, preferably of a valve metal, such as e.g. tantalum, is conventionally also pressed into the electrode body here. The electrode body is then coated, for example by electrochemical oxidation, with a dielectric, i.e. an oxide layer. Alternatively, metal foils can also be etched, and coated with a dielectric by electrochemical oxidation in order to obtain an anode foil with a porous region. In a wound capacitor, an anode foil with a porous region, which forms the electrode body, and a cathode foil are separated by separators and wound up.

In the context of the invention, valve metal is to be understood as meaning those metals of which the oxide layers do not render possible current flow equally in both directions. In the case of an anodically applied voltage, the oxide layers of the valve metals block the current flow, while in the case of a cathodically applied voltage large currents occur, which may destroy the oxide layer. The valve metals include Be, Mg, Al, Ge, Si, Sn, Sb, Bi, Ti, Zr, Hf, V, Nb, Ta and W and an alloy or compound of at least one of these metals with other elements. The best known representatives of the valve metals are Al, Ta and Nb. Compounds with electrical properties comparable to a valve metal are those with metallic conductivity, which can be oxidized and of which the oxide layers have the properties described above. For example, NbO has metallic conductivity, but in general is not regarded as a valve metal. Layers of oxidized NbO have, however, the typical properties of valve metal oxide layers, so that NbO or an alloy or compound of NbO with other elements are typical examples of such compounds with electrical properties comparable to a valve metal. Electrode materials of tantalum, aluminium and those electrode materials based on niobium or niobium oxide are preferred. Aluminium is particularly preferred as the electrode material.

For production of the electrode body often with a porous region, the valve metals can be sintered, for example in powder form, to give a usually porous electrode body, or a porous structure is stamped on a metallic body. The latter can be carried out e.g. by etching a foil.

For simplicity, bodies having a porous region are also called porous in the following. Thus, for example, electrode bodies having a porous region are also called porous electrode bodies. On the one hand, the porous bodies can be permeated by a plurality of channels and therefore be sponge-like. This is often the case if tantalum is used for construction of the capacitor. Furthermore, it is possible for only the surface to have pores and for the region following under the surface pores to be solid in construction. Such a situation is often observed if aluminium is used for construction of the capacitor. Preferably, the electrode body is porous.

The often porous electrode bodies produced in this manner are then oxidized, for example, in a suitable electrolyte, such as e.g. phosphoric acid or an aqueous solution of ammonium adipate, by application of a voltage, in order to form the dielectric. The level of this forming voltage depends on the oxide layer thickness to be achieved or the later use voltage of the capacitor. Preferred forming voltages lie in a range of from 1 to 500 V, particularly preferably in a range of from 2 to 150 V, very particularly preferably in a range of from 3 to 60 V.

The as a rule porous electrode bodies employed preferably have a porosity of from 10 to 90%, preferably from 30 to 80%, particularly preferably from 50 to 80% and an average pore diameter of from 10 to 10,000 nm, preferably from 20 to 5,000 nm, particularly preferably from 50 to 3,000 nm.

According to a first particular embodiment of the process according to the invention, the electrolyte capacitor to be produced is an aluminium wound capacitor. In this case, in process step a) a porous aluminium foil is formed anodically as the electrode material, an aluminium oxide coating being formed as the dielectric. The aluminium foil (anode foil) obtained in this manner is then provided with a contact wire and wound up with a further porous aluminium foil (cathode foil) likewise provided with a contact wire, these two foils being spaced from one another by one or more separator papers, which are based e.g. on cellulose or, preferably, on synthetic papers. After being wound up, the anode bodies obtained in this way are fixed, for example by means of an adhesive tape. The separator paper or papers can be carbonized by heating in an oven. This manner of production of anode bodies for aluminium wound capacitors is adequately known from the prior art and is described, for example, in U.S. Pat. No. 7,497,879 B2.

In process step b), in at least a part of the anode body at least one thiophene monomer is then subjected to in situ (that is to say in the anode body) chemical oxidative polymerization in the presence of at least one oxidizing agent and at least one polymer which is characterized by the structural formula (I) reproduced above, a solid electrolyte layer based on a polythiophene being obtained.

The at least one thiophene monomer is preferably a compound of the formula (II)

(II)

wherein
A represents an optionally substituted $C_1$-$C_5$-alkylene radical,
R independently of each other, represents H, a linear or branched, optionally substituted $C_1$-$C_{18}$-alkyl radical, an optionally substituted $C_5$-$C_{12}$-cycloalkyl radical, an optionally substituted $C_6$-$C_{14}$-aryl radical, an optionally substituted $C_7$-$C_{18}$-aralkyl radical, an optionally substituted $C_1$-$C_4$-hydroxyalkyl radical or a hydroxyl radical,
x represents an integer from 0 to 8, and
in the case where several radicals R are bonded to A, these can be identical or different. The general formula (II) is to be understood as meaning that the substituent R can be bonded to the alkylene radical A x times.

Thiophene monomers of the general formula (II) wherein A represents an optionally substituted $C_2$-$C_3$-alkylene radical and x represents 0 or 1 are particularly preferred. 3,4-Ethylenedioxythiophene, which can be polymerized to give poly(3,4-ethylenedioxythiophene), is very particularly preferred as the thiophene monomer.

In the context of the invention, $C_1$-$C_5$-alkylene radicals A are preferably methylene, ethylene, n-propylene, n-butylene or n-pentylene. $C_1$-$C_{18}$-Alkyl R preferably represent linear or branched $C_1$-$C_{18}$-alkyl radicals, such as methyl, ethyl, n- or iso-propyl, n-, iso-, sec- or tertbutyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl or n-octadecyl, $C_5$-$C_{12}$-cycloalkyl radicals R represent, for example, cyclopentyl, cyclohexyl, cycloheptyl, cyclooctyl, cyclononyl or cyclodecyl, $C_6$-$C_{14}$-aryl radicals R represent, for example, phenyl or naphthyl, and $C_7$-$C_{18}$-aralkyl radicals R represent, for example, benzyl, o-, m-, p-Tolyl, 2,3-, 2,4-, 2,5-, 2,6-, 3,4-, 3,5-xylyl or mesityl. The preceding list serves to illustrate the invention by way of example and is not to be considered conclusive.

In the context of the invention, numerous organic groups are possible optional further substituents of the radicals A and/or of the radicals R, for example alkyl, cycloalkyl, aryl, aralkyl, alkoxy, halogen, ether, thioether, disulphide, sulphoxide, sulphone, sulphonate, amino, aldehyde, keto, carboxylic acid ester, carboxylic acid, carbonate, carboxylate, cyano, alkylsilane and alkoxysilane groups and carboxamide groups.

The in situ polymerization of the at least one thiophene monomer is effected by the use of suitable oxidizing agents. Inexpensive oxidizing agents which are easy to handle, e.g. iron-III salts, such as $FeCl_3$, $Fe(ClO_4)_3$ and the iron-III salts of organic acids and of inorganic acids containing organic radicals, and furthermore $H_2O_2$, $K_2Cr_2O_7$, alkali metal and ammonium persulphates, alkali metal perborates, potassium permanganate and copper salts, such as copper tetrafluoroborate, are preferred for practical reasons. The use of persulphates and of iron-III salts of organic acids and of inorganic acids containing organic radicals has the great advantage in use that they do not have a corrosive action. Iron-III salts of inorganic acids containing organic radicals which may be mentioned are, for example, the iron-III salts of the sulphuric acid half-esters of $C_1$-$C_{20}$-alkanols, e.g. the Fe-III salt of lauryl sulphate. Iron-III salts of organic acids which may be mentioned are, for example: the Fe-III salts of $C_1$-$C_{20}$-alkylsulphonic acids, such as methane- and dodecanesulphonic acid; aliphatic $C_1$-$C_{20}$-carboxylic acids, such as 2-ethylhexylcarboxylic acid; aliphatic perfluorocarboxylic acids, such as trifluoroacetic acid and perfluorooctanoic acid; aliphatic dicarboxylic acids, such as oxalic acid, and above all of aromatic sulphonic acids optionally substituted by $C_1$-$C_{20}$-alkyl groups, such as benzenesulphonic acid, p-toluenesulphonic acid and dodecylbenzenesulphonic acid. An oxidizing agent which is very particularly preferred according to the invention is iron(III) tosylate, which is obtainable, for example, in the form of an ethanolic or butanolic solution from Heraeus Precious Metals GmbH & Co. KG under the product names Clevios™ C-B 40 V2, Clevios™ C-B 55 V2, Clevios™ C-B 40 V2 high Fe, Clevios™ C-E, Clevios™ C-E 60, Clevios™ C-E 60 high Fe, Clevios™ C-ER 31 and Clevios™ C-ER 60 (in this context, the letter "B" in the product names indicates that the product is a butanolic solution, while the letter "E" represents an ethanolic solution).

Polymers having the structural formula (I) which are preferably employed are polymers which have a solidification point (SP III)≤50° C., preferably ≤40° C. and still more preferably ≤30° C.

In the structural formula (I), $R^1$ represents a hydrogen atom, a $C_1$-$C_{10}$-alkyl group, an unsaturated $C_1$-$C_{10}$-alkylene group, an acryloyl group or a methacryloyl group, wherein at least one of the radicals $R^1$ represents a $C_1$-$C_{10}$-alkyl group, an unsaturated $C_1$-$C_{10}$-alkylene group, an acryloyl group or a methacryloyl group. The polymers having the structural formula (I) are accordingly oligo- or polyalkylene glycol monoethers (one of the radicals $R^1$ is a $C_1$-$C_{10}$-alkyl group or an unsaturated $C_1$-$C_{10}$-alkylene group and the other radical $R^1$ is a hydrogen atom), oligo- or polyalkylene glycol diethers (both radicals $R^1$ are a $C_1$-$C_{10}$-alkyl group or an unsaturated $C_1$-$C_{10}$-alkylene group), oligo- or polyalkylene glycol monoesters (one of the radicals $R^1$ is an acryloyl group or a methacryloyl group and the other radical $R^1$ is a hydrogen atom), an oligo- or polyalkylene glycol diester (both radicals $R^1$ are an acryloyl group or a methacryloyl group) or a polyalkylene glycol ether ester (one of the radicals $R^1$ is an acryloyl group or a methacryloyl group and the other radical $R^1$ is a $C_1$-$C_{10}$-alkyl group or an unsaturated $C_1$-$C_{10}$-alkylene group), oligo- or polyalkylene glycol monoethers, in particular oligo- or polyalkylene glycol monoalkyl ethers in which one of the radicals $R^1$ is a $C_1$-$C_{10}$-alkyl group being very particularly preferred.

Polymers having the structural formula (I) which are furthermore preferably employed are those polymers in which the radical $R^2$ represents a radical chosen from the group consisting of —$CH_2$—$CH_2$—, —$CHCH_3$—$CH_2$— or —$CH_2$—CHOH—$CH_2$—. The polymers are accordingly particularly preferably oligo- or polyethylene glycol derivatives, oligo- or polypropylene glycol derivatives (optionally also derivatives based on copolymers of ethylene glycol and propylene glycol, wherein the ethylene glycol units and the propylene glycol units in these copolymer can be arranged in random distribution or in blocks) or oligo- or polyglycerol derivatives, wherein in the case of polyglycerols a further polyglycerol group can be bonded to the middle OH group of the glycerol monomer units via a further ether function (branched polyglycerols). In this connection, the term "derivative" is understood as meaning the abovementioned monoethers, diethers, monoesters, diesters or ether esters.

According to the invention, an "oligoalkylene glycol derivative" is preferably understood as meaning a compound which comprises 3 to 6 alkylene units (e.g. ethylene and/or propylene units), while a "polyalkylene glycol derivative" is preferably understood as meaning a compound which comprises more than 6 alkylene units (preferably ethylene and/or propylene units).

According to the invention, it is furthermore preferable to employ as polymers having the structural formula (I) those polymers in which at least one radical $R^1$ represents $CH_3$, —$(CH_2)_mCH_3$, where m=1, 2, 3, 4, 5, 6, 7, 8, 9, 10, 11, 12, —$CH_2$—$CH$=$CH_2$, —$CH$=$CH_2$, —$CO$—$CH$=$CH_2$ or —$CO$—$C(CH_3)$=$CH_2$.

According to a particular embodiment of the process according to the invention, polymers having the structural formula (I) which are preferably employed are oligo- or polyalkylene glycol monoalkyl ethers or oligo- or polyalkylene glycol dialkyl ethers, but very particularly preferably oligo- or polyalkylene glycol monoalkyl ethers. Among these oligo- or polyalkylene glycol monoalkyl ethers or oligo- or polyalkylene glycol dialkyl ethers, those which are particularly preferred are polyethylene glycol monoalkyl ethers or polyethylene glycol dialkyl ethers, in particular polyethylene glycol monoalkyl ethers, polypropylene glycol monoalkyl ethers or polypropylene glycol dialkyl ethers, in particular polypropylene glycol monoalkyl ethers, poly(co-ethylene-propylene)monoalkyl ethers or poly(co-ethylene-propylene)dialkyl ethers, in particular poly(co-ethylene-propylene)monoalkyl ethers or mixtures of at least two of these compounds, the polymers having the structural formula (I), in particular the polyalkylene glycol monoalkyl ethers or polyalkylene glycol dialkyl ethers described above, preferably having a molecular weight in a range of from 100 to 10,000 g/mol, particularly preferably in a range of from 250 to 2,500 g/mol. The polyalkylene glycol monomethyl ethers or the polyalkylene glycol dimethyl ethers, in particular the polyalkylene glycol monomethyl ethers, the polyalkylene glycol monoethyl ethers or the polyalkylene glycol diethyl ethers, in particular the polyalkylene glycol monoethyl ethers, the polyalkylene glycol monopropyl ethers or the polyalkylene glycol dipropyl ethers, in particular the polyalkylene glycol monopropyl ethers, and the polyalkylene glycol monobutyl ethers or the polyalkylene glycol dibutyl ethers, in particular the polyalkylene glycol monobutyl ethers, are furthermore preferred in this connection.

Preferably, the polymers having the structural formula (I) which are employed in the process according to the invention have a boiling point ≥150° C., still more preferably ≥175° C., still more preferably ≥200° C., still more preferably ≥225° C., still more preferably ≥250° C. If the polymer having the structural formula (I) has no boiling point but decomposes on heating, the polymers having the structural formula (I) which are employed in the process according to the invention have a decomposition point in air ≥150° C., still more preferably ≥175° C., still more preferably ≥200° C., still more preferably ≥225° C., still more preferably ≥250° C. If the polymers having the structural formula (I) are a mixture of at least two different polymers having the structural formula (I), it is sufficient for at least one of these polymers to have a boiling point or a decomposition point above the temperatures described above.

It is furthermore preferable in the process according to the invention for the polymer having the structural formula (I) and the thiophene monomer to be employed in a weight ratio of polymer having the structural formula (I): thiophene monomer of at least 0.1:1, particularly preferably at least 0.25:1 and still more preferably at least 0.5:1, it being possible for the weight ratio to be, for example, in a range of from 0.1:1 to 20:1, 0.25:1 to 15:1 or 0.5:1 to 10:1.

According to a preferred embodiment of the process according to the invention, the reaction solution employed for the in situ polymerization additionally comprises a polyalkylene glycol having a molecular weight in a range of from 100 to 2,000 g/mol (that is to say a compound of the structural formula (I) in which both radicals $R^1$ represent a hydrogen atom and $R^2$ represent an alkylene group), very particularly preferably a polyethylene glycol, a polypropylene glycol or a poly(co-ethylene-propylene)glycol having a molecular weight in a range of from 100 to 2,000 g/mol. In this connection it is furthermore preferable for the reaction solution to comprise the polymer having the structural formula (I) and the polyalkylene glycol in a weight ratio in a range of from 1:10 to 10:1, particularly preferably in a range of from 1:4 to 4:1, still more preferably in a range of from 1:3 to 3:1 and most preferably in a range of from 1:2 to 2:1.

In the polymerization of the thiophene monomers, in addition to the oxidizing agent, the polymer having the structural formula (I) and optionally the polyalkylene glycol, further additives which differ from the thiophene monomer, the oxidizing agent, the polymer having the structural formula (I) and the polyalkylene glycol can furthermore be present.

Possible additives are, in particular, solvents in which, for example, the oxidizing agent can be dissolved or dispersed. Preferred solvents are aliphatic alcohols, such as methanol, ethanol, i-propanol and n-butanol; aliphatic ketones, such as acetone and methyl ethyl ketone; aliphatic carboxylic acid esters, such as ethyl acetate and butyl acetate; aromatic hydrocarbons, such as toluene and xylene; aliphatic hydrocarbons, such as hexane, heptane and cyclohexane; chlorohydrocarbons, such as methylene chloride and dichloroethane; aliphatic nitriles, such as acetonitrile; aliphatic sulphoxides and sulphones, such as dimethylsulphoxide and sulpholane; aliphatic carboxylic acid amides, such as methylacetamide and dimethylformamide; aliphatic and araliphatic ethers, such as diethyl ether and anisole. Water or mixtures of water with the abovementioned organic solvents can furthermore also be used as the solvent. Alcohols, in particular ethanol or n-butanol, which are present, for example, during the polymerization if ethanolic or butanolic solutions of the oxidizing agent, for example the oxidizing agents from Heraeus Precious Metals GmbH & Co. KG described above, are employed, are particularly preferred as the solvent.

Possible additives are furthermore binders, such as polyvinyl acetate, polycarbonate, polyvinyl butyrate, polyacrylic acid esters, polymethacrylic acid esters, polystyrene, polyacrylonitrile, polyvinyl chloride, polybutadiene, polyisoprene, polyesters, silicones, and pyrrole/acrylic acid ester, vinyl acetate/acrylic acid ester and ethylene/vinyl acetate copolymers which are soluble in organic solvents. Water-soluble binders, such as polyvinyl alcohols, can also be used as thickening agents.

The in situ polymerization of the thiophene monomer in at least a part of the anode body in the presence of the oxidizing agent and the polymer having the general structural formula (I) and optionally in the presence of one or more of the abovementioned additives is carried out by a procedure in which the components are introduced into at least a part of the anode body (in the porous region) and the thiophene monomers are then polymerized, the polymerization being carried out at a temperature in a range of from 20 to 300° C., particularly preferably in a range of from 23° C. to 250° C. over a period in a range of from 1 minute to 12 hours, particularly preferably in a range of from 15 minutes to 10 hours.

The introduction of the components (thiophene monomer, oxidizing agent, polymer of the structural formula (I), optionally polyalkylene glycol and optionally further additives) into at least a part of the anode body can be carried out in various ways. Thus, according to one embodiment of the process according to the invention, all the components are introduced into at least a part of the anode body together in the form of a single solution or dispersion comprising all the components. However, it is also conceivable to introduce the thiophene monomer and the oxidizing agent separately from one another. Thus, for example, the oxidizing agent can be introduced together with the polymer having the structural formula (I), optionally the polyalkylene glycol and optionally further additives in the form of a solution or dispersion and subsequently (or beforehand), separately from this, the thiophene monomer can be introduced in the form of a solution or dispersion, which can optionally comprise further additives. However, if the thiophene monomer and oxidizing agent are added separately, it is preferable for the thiophene monomer to be introduced together with the polymer of the structural formula (I), optionally the polyalkylene glycol and optionally further additives in the form of a solution or dispersion and subsequently (or beforehand), separately from this, for the oxidizing agent to be introduced in the form of a solution or dispersion, which can optionally comprise further additives.

The introduction of the components (separately or together) into the porous region can be carried out by known processes, e.g. impregnation, dipping, pouring, dripping on, spraying, misting on, knife coating, brushing or printing, for example ink-jet, screen or tampon printing. Preferably, the introduction is carried out by a procedure in which the anode body provided in process step a) is immersed in a solution or dispersion comprising all the components (thiophene monomer, oxidizing agent, polymer of the structural formula (I), optionally polyalkylene glycol and optionally further additives) or some of the components (in the case of the sequential addition described above) and is thus impregnated with the components or with some of the components. The immersion or the impregnation is preferably carried out for a period in a range of from 1 second to 120 minutes, particularly preferably in a range of from 10 seconds to 60 minutes and most preferably in a range of from 30 seconds to 15 minutes. The introduction of the components or some of the components into the anode body can be facilitated, for example, by increased or reduced pressure, vibration, ultrasound or heat.

After the electrolyte has been deposited on the dielectric layer after the polymerization, the electrolyte capacitors can be finished in the manner known to the person skilled in the art. In the case of a tantalum electrolyte capacitor, the capacitor bodies can be covered, for example, with a graphite layer and a silver layer, as is known from DE-A-10 2005 043 828, while in the case of an aluminium wound capacitor, in accordance with the teaching of U.S. Pat. No. 7,497,879 B2, the capacitor body is incorporated in an aluminium beaker, provided with a sealing inspection glass and firmly closed mechanically by crimping. The capacitor can then be freed from defects in the dielectric in a known manner by ageing.

A contribution towards achieving the abovementioned objects is also made by a capacitor which is obtainable by the process according to the invention.

A contribution towards achieving the abovementioned objects is also made by a capacitor comprising an electrode body of an electrode material, wherein a dielectric covers one surface of this electrode material at least partly to form an anode body, and a solid electrolyte layer comprising a polythiophene and a polymer having the structural formula (I) as defined above, wherein the break-through voltage is greater than 50%, preferably greater than 60%, more preferably greater than 70% and most preferably greater than 80% of the forming voltage. If, for example, the forming voltage is 36 V, the break-through voltage is at least 18 V (50%), preferably at least 21.6 V (60%), more preferably at least 25.2 V (70%) and most preferably at least 28.8 V (80%).

As the electrode body of an electrode material, the dielectric, the polythiophene and the polymer having the structural formula (I) those electrode bodies, dielectrics, polythiophenes and polymers having the structural formula (I) are preferred that have already been described as preferred embodiments in connection with the process of the present invention.

According to a preferred embodiment of the capacitor according to the present invention the solid electrolyte layer comprises less than 10 wt.-%, preferably less than 1 wt.-% and most preferably less than 0.1 wt.-%, in each case based on the total weight of the solid electrolyte layer, of a polymeric anion, especially of polystyrene sulfonic acid, wherein it is particularly preferred that the solid electrolyte layer is substantially free of a polymeric anion, especially substantially free of polystyrene sulfonic acid. Furthermore it is preferred that the polythiophene in the solid electrolyte layer is not present in the form of a polythiophene/polyanion-complex.

A contribution towards achieving the abovementioned objects is also made by a reaction solution comprising
(γ1) at least one thiophene monomer;
(γ2) at least one oxidizing agent;
(γ3) at least one polymer which is characterized by the structural formula (I)

$$R^1\!\!-\!\!\left[\!O\!-\!R^2\!\right]_{\!n}\!O\!-\!R^1 \qquad (I)$$

in which
n is an integer ≥3;
the radicals $R^2$ within the structural formula (I) can be identical or different and represent an alkylene group optionally containing a hydroxyl group or a polyether group;
the radicals $R^1$ within the structural formula (I) can be identical or different and represent a hydrogen atom, a $C_1$-$C_{10}$-alkyl group, an unsaturated $C_1$-$C_{10}$-alkylene group, an acryloyl group or a methacryloyl group, wherein at least one of the radicals $R^1$ represents a $C_1$-$C_{10}$-alkyl group, an unsaturated $C_1$-$C_{10}$-alkylene group, an acryloyl group or a methacryloyl group,
(γ4) optionally one or more additives which differ from components (γ1) to (γ3),
wherein the sum of components (γ1) to (γ4) is 100 wt. % and the reaction solution comprises the polymer (γ3) having the structural formula (I) in a concentration of at least 1 wt. %, particularly preferably at least 5 wt. %, still more preferably at least 10 wt. % and most preferably at least 14 wt. %, in each case based on the total weight of the reaction solution.

This reaction solution is suitable in particular for the production of an electrolyte capacitor by the process of in situ polymerization described in EP-A-0 340 512.

Preferred thiophene monomers (γ1), oxidizing agents (γ2), polymers having the structural formula (I) (γ3) and additives (γ4) are in turn those compounds or components which have already been mentioned above as preferred thiophene monomers, oxidizing agents, as polymers having the structural formula (I) and as additives in connection with the process according to the invention.

According to the invention, the weight ratio of component (γ3) to component (γ1) is at least 0.1:1, particularly preferably at least 0.25:1 and still more preferably at least 0.5:1, it being possible for the weight ratio to be, for example, in a range of from 0.1:1 to 20:1, 0.25:1 to 15:1 or 0.5:1 to 10:1.

It is furthermore preferable according to the invention for the concentration of component (γ1) in the reaction solution to be in a range of from 1 to 30 wt. %, particularly preferably in a range of from 1.5 to 20 wt. % and most preferably in a range of from 2.5 to 15 wt. %, in each case based on the total weight of the reaction solution.

It is furthermore preferable according to the invention for the concentration of component (γ2) in the reaction solution to be in a range of from 10 to 60 wt. %, particularly preferably in a range of from 15 to 55 wt. % and most preferably in a range of from 20 to 50 wt. %, in each case based on the total weight of the reaction solution.

It is furthermore preferable according to the invention for the concentration of component (γ3) in the reaction solution to be in a range of from 1 to 50 wt. %, particularly preferably in a range of from 3 to 30 wt. % and most preferably in a range of from 5 to 20 wt. %, in each case based on the total weight of the reaction solution.

It is furthermore preferable according to the invention for the concentration of component (γ4) in the reaction solution to be in a range of from 1 to 70 wt. %, particularly preferably in a range of from 5 to 60 wt. % and most preferably in a range of from 10 to 50 wt. %, in each case based on the total weight of the reaction solution.

According to a particular embodiment of the reaction solution according to the invention, this comprises as a further component (γ5) a polyalkylene glycol having a molecular weight in a range of from 100 to 2,000 g/mol (that is to say a compound of the structural formula (I) in which both radicals $R^1$ represent a hydrogen atom and $R^2$ represent an alkylene group), very particularly preferably a polyethylene glycol, a polypropylene glycol or a poly(co-ethylenepropylene)glycol having a molecular weight in a range of from 100 to 2,000 g/mol. In this connection it is furthermore preferable for the reaction solution to comprise the polymer having the structural formula (I) and the polyalkylene glycol in a weight ratio in a range of from 1:10 to 10:1, preferably 1:4 to 4:1, particularly preferably in a range of from 1:3 to 3:1 and most preferably in a range of from 1:2 to 2:1.

According to a very particularly preferred embodiment of the composition according to the invention, this comprises (γ1) 5 to 20 wt. % of the thiophene monomer, preferably 3,4-ethylenedioxythiophene;

(γ2) 25 to 65 wt. % of the oxidizing agent, preferably iron(III) tosylate;

(γ3) 10 to 30 wt. % of the polymer of the structural formula (I), preferably a polyethylene glycol monoalkyl ether having a molecular weight in a range of from 200 to 10,000 g/mol;

(γ4) 25 to 50 wt. % of a solvent as an additive, preferably ethanol or butanol;

(γ5) 0 to 30 wt. % of a polyalkylene glycol having a molecular weight in a range of from 100 to 2,000 g/mol, preferably a polyethylene glycol having a molecular weight in a range of from 100 to 2,000 g/mol.

The preparation of the composition according to the invention can be carried out by simple mixing of the components. In this context, for example, in the preparation of the composition according to the invention the oxidizing agent (γ2) can already be dissolved or dispersed in a solvent (γ4) and this solution or dispersion can then be mixed with the thiophene monomer (γ1), the polymer of the structural formula (I) (γ3) and optionally further additives (γ4).

A contribution towards achieving the abovementioned objects is also made by the use of the capacitors obtainable by the process according to the invention in electronic circuits, for example as a filter capacitor or decoupling capacitor. Electronic circuits such as are found, for example, in computers (desktop, laptop, server), in computer peripherals (e.g. PC cards), in portable electronic equipment, such as e.g. mobile telephones, digital cameras or electronic devices for entertainment, in electronic equipment for entertainment, such as e.g. in CD/DVD players and computer games consoles, in navigation systems, in telecommunications installations, in domestic appliances, in medical technology, e.g. for defibrillators, in power supplies, such as those based on renewable energy, or in automobile electronics, such as e.g. for hybrid or electric automobiles, are preferred.

A contribution towards achieving the abovementioned objects is moreover made by such electronic circuits comprising a capacitor obtainable by the process according to the invention.

The invention is now explained in more detail with the aid of non-limiting figures and examples.

Figure 1:
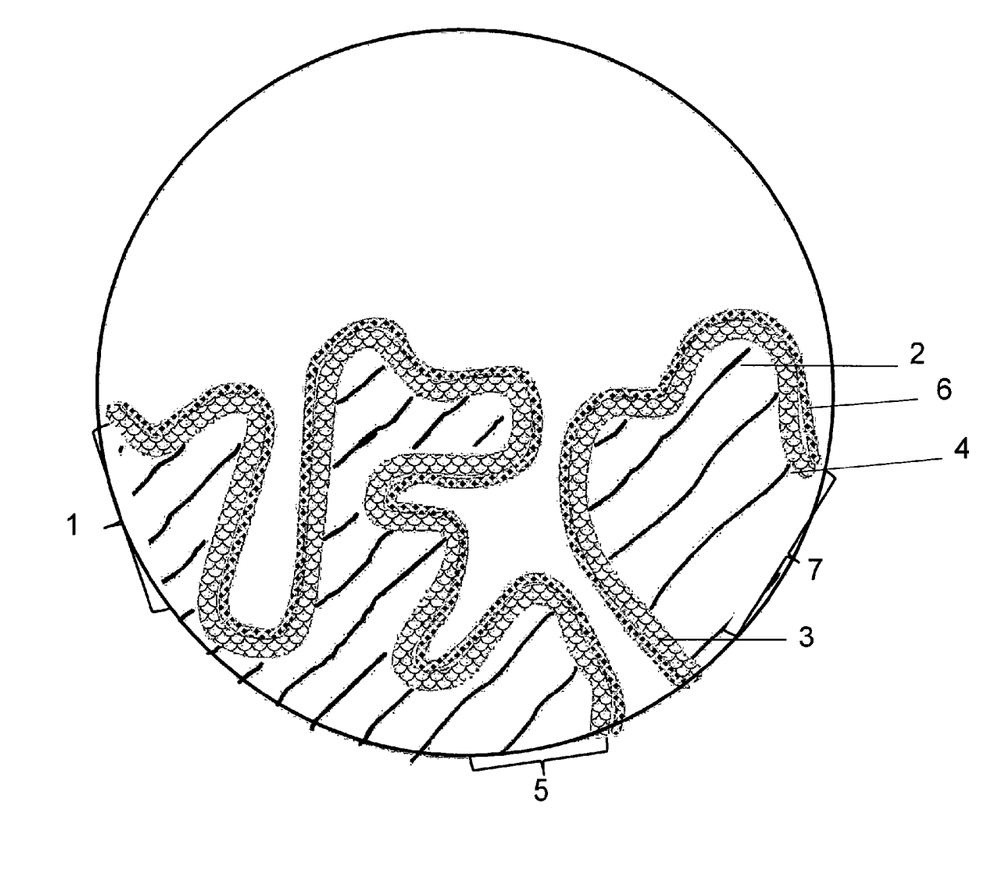
FIG. 1 is a diagram of a section through a part of a capacitor.

FIG. 1 is a diagram of a section through a part of a capacitor according to the invention which is obtainable by a process comprising process steps a) and b). This has an electrode body 1, usually made of a porous electrode material 2, such as aluminium. On the surface 4 of the electrode material 2, a dielectric 3 is formed as a thin layer, so that an anode body 5 which is still porous and comprises the electrode body 1 of the electrode material 2 and the dielectric 3 is formed. The dielectric 3 is followed, optionally after further layers, by a layer of a solid electrolyte 6 (e.g. based on PEDOT), whereby a capacitor body 7 comprising the electrode body 1 of the electrode material 2, the dielectric 3 and the solid electrolyte 6 is formed. The layer of the solid electrolyte 6 comprises a polymer of the structural formula (I).

Measurement Methods

Low Temperature Properties

The capacitance (in microfarads) was determined at 20° C. and at −40° C. at 120 Hz by means of an LCR meter (Agilent 4284A). In each case 10 capacitors were produced and the mean was determined. The "low temperature properties" evaluated on the basis of the capacitance measurements are described in the following tables as good ("+") if the capacitance at −40° C. drops compared with the capacitance determined at 20° C. by not more than 10%. If the capacitance drops by 10% to 20%, the low temperature properties are indicated with "0" in the tables, and if the capacitance drops by more than 20% the low temperature properties are inadequate (indicated with "−" in the tables).

Life Test

The equivalent series resistance (in mΩ) was determined at 20° C. at 100 kHz by means of an LCR meter (Agilent 4284A). In each case 10 capacitors were produced and the mean was determined. The "life" evaluated on the basis of the measurement of the equivalent series resistance is described in the following tables as good ("+") if the equivalent series resistance increases by not more than 10% after 500 h of storage at 120° C. (no voltage is applied during this storage). If it increases by more than 10% during this storage, the life is inadequate (indicated with "−" in the tables).

Determination of the Break-Through Voltage

For the determination of the break-through voltage the capacitor is provided with a series resistor of 1,000Ω and subjected to an increasing voltage starting from 0 V, with voltage steps of 1 Ws. The current which thereby occurred was measured with a Keithley 199 Multimeter. The voltage value at which the current occurring rose to more than 1 mA was specified as the break-through voltage.

Mean

Unless specified otherwise here, the mean is the arithmetic mean.

EXAMPLES

A) Production of Oxidized Electrode Bodies

A porous aluminium foil, formed at 36 V, having dimensions of 200 mm×3 mm (anode foil) and a porous aluminium foil having dimensions of 210 mm×3 mm (cathode foil) were each provided with a contact wire and were then wound up together with two cellulose separator papers and fixed with an adhesive tape. The separator paper of the oxidized electrode bodies was then carbonized in an oven at 300° C.

B) Production of Aluminium Wound Capacitors

Example 1

According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus), 2.5 g of PEG-400 and 2.5 g of tetraethylene glycol dimethyl ether.

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 1.

Example 2

According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of tetraethylene glycol dimethyl ether.

The polymerization takes place during the subsequent storage at room temperature for 15 min and then at 85° C. for 30 min.

The life after storage for 500 h at 120° C. and the loss of capacitance at −40° C. of the capacitors produced in the above manner are to be found in Table 1.

Comparative Example 1

Not According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of ethylene glycol.

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 1.

Comparative Example 2

Not According to the Invention

The oxidized electrode bodies from A) are impregnated in a mixture comprising 8 g of EDOT (Clevios™ M V2), 22 g of ethylene glycol and 36.7 g of oxidizing agent (Clevios™ CE 60, 60% strength solution of Fe(III) tosylate in ethanol, Heraeus).

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 1.

Comparative Example 3

Not According to the Invention

The oxidized electrode bodies from A) are impregnated in a mixture comprising 5 g of EDOT (Clevios™ M V2) and 25 g of oxidizing agent (Clevios™ CE 60, 60% strength solution of Fe(III) tosylate in ethanol, Heraeus).

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 1.

Comparative Example 4

Not According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of PEG-400.

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 1.

Example 3

According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of poly-(ethylene glycol-ran-propylene glycol)monobutyl ether (Aldrich; molecular weight about 970 g/mol).

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are shown in Table 1.

Example 4

According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of polypropylene glycol monobutyl ether (molecular weight about 1,000 g/mol).

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are shown in Table 1.

Example 5

According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 2.5 g of poly-(ethylene glycol-ran-propylene glycol)monobutyl ether (Aldrich; molecular weight about 970 g/mol) and 2.5 g of PEG-400.

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are shown in Table 1.

Example 6

According to the Invention

The oxidized electrode bodies from A) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus), 2.5 g of PEG-400 and 2.5 g of polypropylene glycol monobutyl ether (molecular weight about 1,000 g/mol).

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are shown in Table 1.

Example 7

According to the Invention

The oxidized electrode bodies from C) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of poly-(ethylene glycol) methyl ether methacrylate. The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 1.

TABLE 1

| | Life after 500 h at 120° C. | Loss of capacitance At −40° C. | Break-through voltage [V] |
|---|---|---|---|
| Comparative Example 1 | − | + | |
| Comparative Example 2 | − | + | |
| Comparative Example 3 | − | + | 17 |
| Comparative Example 4 | + | − | |
| Example 1 | + | + | |
| Example 2 | + | + | |
| Example 3 | + | + | |
| Example 4 | + | + | 29 |
| Example 5 | + | 0 | |
| Example 6 | + | 0 | |
| Example 7 | + | + | 30 |

C) Production of Oxidized Electrode Bodies

A porous aluminium foil, formed at 92 V, having dimensions of 200 mm×5 mm (anode foil) and a porous aluminium foil having dimensions of 240 mm×5 mm (cathode foil) were each provided with a contact wire and were then wound up together with two cellulose separator papers and fixed with an adhesive tape. 10 of these oxidized electrode bodies were produced. The separator paper of the oxidized electrode bodies was then carbonized in an oven at 300° C.

D) Production of Aluminium Wound Capacitors

Example 8

According to the Invention

The oxidized electrode bodies from C) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus) and 5 g of tetraethylene glycol dimethyl ether.

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 2.

Example 9

According to the Invention

The oxidized electrode bodies from C) are impregnated in a mixture comprising 5 g of EDOT (Clevios™ M V2, Heraeus), 25 g of oxidizing agent (Clevios™ CE 60, 60% strength solution of Fe(III) tosylate in ethanol, Heraeus), 2.5 g of PEG-400 and 2.5 g of tetraethylene glycol dimethyl ether.

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 2.

Comparative Example 5

Not According to the Invention

The oxidized electrode bodies from C) are impregnated in a mixture comprising 10 g of EDOT (Clevios™ M V2, Heraeus) and 50 g of oxidizing agent (Clevios™ CE 60, 60% strength solution of Fe(III) tosylate in ethanol, Heraeus).

The polymerization takes place during the subsequent storage at room temperature for 15 min and then at 85° C. for 30 min.

The life after storage for 500 h at 120° C. and the low temperature properties (loss of capacitance at −40° C.) of the capacitors produced in the above manner are to be found in Table 2.

TABLE 2

|  | Life test after 500 h at 120° C. | Loss of capacitance at −40° C. |
| --- | --- | --- |
| Comparative Example 5 | − | + |
| Example 8 | + | + |
| Example 9 | + | + |

LIST OF REFERENCE SYMBOLS

1 Electrode body
2 Electrode material
3 Dielectric
4 Surface
5 Anode body
6 Solid electrolyte
7 Capacitor body

The invention claimed is:

1. A process for the production of a capacitor, comprising the process steps:
   a) the provision of an electrode body of an electrode material, wherein a dielectric covers one surface of this electrode material at least partly to form an anode body;
   b) the in situ polymerization of at least one thiophene monomer in at least a part of the anode body in the presence of at least one oxidizing agent and at least one polymer, wherein the polymer has the structural formula (I)

(I)

in which
      n is an integer ≥3;
      the radicals $R^2$ within the structural formula (I) can be identical or different and represent an alkylene group optionally containing a hydroxyl group or a polyether group;
      the radicals $R^1$ within the structural formula (I) can be identical or different and represent a hydrogen atom, a $C_1$-$C_{10}$-alkyl group, an unsaturated $C_1$-$C_{10}$-alkylene group, an acryloyl group or a methacryloyl group, wherein at least one of the radicals $R^1$ represents a $C_1$-$C_{10}$-alkyl group, an unsaturated $C_1$-$C_{10}$-alkylene group, an acryloyl group or a methacryloyl group;
   wherein a reaction solution comprising the at least one thiophene monomer, the at least one polymer having the structural formula (I), the at least one oxidizing agent and optionally one or more additives, which comprises the polymer having the structural formula (I) in a concentration of at least 1 wt. %, based on the total weight of the reaction solution, is employed for the in situ polymerization.

2. The process according to claim 1, wherein the thiophene monomer is 3,4-ethylenedioxythiophene.

3. The process according to claim 1, wherein iron(III) tosylate is employed as the oxidizing agent in the in situ polymerization.

4. The process according to, wherein in the structural formula (I) the radical $R^2$ represents a radical chosen from the group consisting of —$CH_2$—$CH_2$—, —$CHCH_3$—$CH_2$— or —$CH_2$—CHOH—$CH_2$—.

5. The process according to claim 1, wherein in the structural formula (I) at least one radical $R^1$ represents $CH_3$, —$(CH_2)_m CH_3$, where m=1, 2, 3, 4, 5, 6, 7, 8, 9, 10, 11, 12, —$CH_2$—CH═$CH_2$, —CH═$CH_2$, —CO—CH═$CH_2$ or —CO—C($CH_3$)═$CH_2$.

6. The process according to claim 1, wherein the polymer having the structural formula (I) is an oligo- or polyalkylene glycol monoalkyl ether or an oligo- or polyalkylene glycol dialkyl ether.

7. The process according claim 1, wherein the polymer having the structural formula (I) is a polyethylene glycol monoalkyl ether, a polypropylene glycol monoalkyl ether or a poly(co-ethylene-propylene) monoalkyl ether.

8. The process according to claim 1, wherein the polymer having the structural formula (I) has a molecular weight in a range of from 100 to 10,000 g/mol.

9. The process according to claim 1, wherein the reaction solution employed for the in situ polymerization additionally comprises a polyalkylene glycol having a molecular weight in a range of from 100 to 2,000 g/mol.

10. The process according to claim 9, wherein the reaction solution comprises the polymer having the structural formula (I) and the polyalkylene glycol in a weight ratio in a range of from 1:10 to 10:1.

11. The process according to claim 1, wherein the polymer having the structural formula (I) and the thiophene monomer are employed in a weight ratio of polymer having the structural formula (I): thiophene monomer of at least 0.1:1.

12. The process according to claim 1, wherein the polymerization is carried out at a temperature in a range of from 20 to 300° C. over a period in a range of from 1 minute to 12 hours.

* * * * *